(12) United States Patent
Tahara et al.

(10) Patent No.: US 9,859,102 B2
(45) Date of Patent: Jan. 2, 2018

(54) METHOD OF ETCHING POROUS FILM

(71) Applicant: TOKYO ELECTRON LIMITED, Tokyo (JP)

(72) Inventors: Shigeru Tahara, Miyagi (JP); Eiichi Nishimura, Miyagi (JP); Mikhail Baklanov, Herent (BE); Liping Zhang, Leuven (BE); Jean-Francois de Marneffe, Bossut-Gottechain (BE)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/131,459

(22) Filed: Apr. 18, 2016

(65) Prior Publication Data

US 2016/0307732 A1    Oct. 20, 2016

(30) Foreign Application Priority Data

Apr. 20, 2015 (JP) ................................ 2015-085878

(51) Int. Cl.
 *H01J 37/32* (2006.01)
 *H01L 21/311* (2006.01)
(52) U.S. Cl.
 CPC .. *H01J 37/32449* (2013.01); *H01J 37/32477* (2013.01); *H01L 21/31116* (2013.01)
(58) Field of Classification Search
 None
 See application file for complete search history.

(56) References Cited

U.S. PATENT DOCUMENTS

| | | | | |
|---|---|---|---|---|
| 4,583,996 A * | 4/1986 | Sakata | ................... | B01D 53/22 264/167 |
| 8,540,890 B2 * | 9/2013 | Baklanov | ............... | H01B 19/04 216/56 |
| 8,961,803 B1 * | 2/2015 | Baklanov | .......... | H01L 21/76802 216/56 |

(Continued)

FOREIGN PATENT DOCUMENTS

EP  2 595 182 A1  5/2013
EP  2 849 212 A1  3/2015

OTHER PUBLICATIONS

Liping Zhang et al., "Damage Free Cryogenic Etching of a Porous Organosilica Ultralow-k Film," ECS Solid State Letters, 2 (2) N5-N7 (2013) (3 pages).

(Continued)

*Primary Examiner* — Allan Olsen
(74) *Attorney, Agent, or Firm* — Rothwell, Figg, Ernst & Manbeck, P.C.

(57) ABSTRACT

A method of etching a porous film is provided. The method includes supplying a first gas into a processing chamber of a plasma processing apparatus in which an object to be processed including a porous film is accommodated, and generating a plasma of a second gas for etching the porous film in the processing chamber. The first gas is a processing gas having a saturated vapor pressure of less than or equal to 133.3 Pa at a temperature of a stage on which the object is mounted in the processing chamber, or includes the processing gas. In the step of supplying the first gas, no plasma is generated, and a partial pressure of the processing gas which is supplied into the processing chamber is set to be greater than or equal to 20% of the saturated vapor pressure.

11 Claims, 13 Drawing Sheets

(56) References Cited

U.S. PATENT DOCUMENTS

| | | | |
|---|---|---|---|
| 9,117,666 B2* | 8/2015 | Le | H01L 21/02343 |
| 2003/0001282 A1* | 1/2003 | Meynen | H01L 21/76802 |
| | | | 257/777 |
| 2004/0071878 A1* | 4/2004 | Schuhmacher | C23C 14/04 |
| | | | 427/255.28 |
| 2005/0148202 A1* | 7/2005 | Heiliger | C09J 143/04 |
| | | | 438/778 |
| 2006/0024849 A1* | 2/2006 | Zhu | G01N 7/14 |
| | | | 438/12 |
| 2007/0093078 A1* | 4/2007 | Harada | C23C 16/401 |
| | | | 438/790 |
| 2008/0241499 A1* | 10/2008 | Sinapi | H01L 21/02074 |
| | | | 428/304.4 |
| 2008/0261405 A1* | 10/2008 | Yang | H01L 21/02063 |
| | | | 438/711 |
| 2013/0075876 A1* | 3/2013 | Goethals | H01L 21/31058 |
| | | | 257/642 |
| 2013/0337583 A1* | 12/2013 | Kobayashi | H01L 21/76825 |
| | | | 438/4 |
| 2014/0083979 A1* | 3/2014 | Tahara | H01L 21/02057 |
| | | | 216/67 |
| 2014/0206198 A1* | 7/2014 | Tahara | H01L 21/02057 |
| | | | 438/715 |
| 2014/0322921 A1* | 10/2014 | Ahmad | H05B 6/80 |
| | | | 438/780 |
| 2014/0353835 A1* | 12/2014 | Chae | H01L 21/76843 |
| | | | 257/773 |
| 2014/0367868 A1* | 12/2014 | Ono | H01L 23/293 |
| | | | 257/788 |
| 2015/0064925 A1* | 3/2015 | Tahara | H01L 21/0234 |
| | | | 438/723 |
| 2016/0025899 A1* | 1/2016 | Ishizeki | G02B 1/113 |
| | | | 428/141 |
| 2016/0049293 A1* | 2/2016 | Li | C23C 16/401 |
| | | | 438/780 |
| 2016/0093485 A1* | 3/2016 | Kobayashi | H01L 21/0228 |
| | | | 438/763 |
| 2016/0276133 A1* | 9/2016 | Baklanov | H01J 37/32009 |
| 2016/0307734 A1* | 10/2016 | Tahara | C23C 16/50 |

OTHER PUBLICATIONS

Markus H. Heyne et al., "Quantitative characterization of pore stuffing and unstuffing for postporosity plasma protection of low-k materials," Journal of Vaccum Science & Technology B 32, 062202 (2014) (11 pages).

* cited by examiner

METHOD OF ETCHING POROUS FILM

CROSS-REFERENCE TO RELATED APPLICATIONS

This application claims priority to Japanese Patent Application No. 2015-085878 filed on Apr. 20, 2015, the entire contents of which are incorporated herein by reference.

TECHNICAL FIELD

Embodiments of the disclosure relate to a method of etching a porous film.

BACKGROUND ART

In an electronic device such as a semiconductor device, a porous film may be used. As the porous film, for example, a film formed of a low dielectric constant material such as a SiOC film is used. In manufacturing of such an electronic device, a process is performed in which a fine pattern formed in a photoresist by lithography is transferred to a hard mask such as a TiN film, a $SiO_2$ film, or a $Si_3N_4$ film by plasma etching, as necessary, and the pattern is subsequently transferred to the porous film.

In the plasma etching of the porous film, radicals are generated by exciting a gas for etching in a processing chamber of a plasma processing apparatus. The radicals may enter pores of the porous film to damage the porous film. For this reason, there have been proposed some technologies for protecting the porous film from the radicals.

For example, Reference 1 (Liping Zhang et al., "Damage Free Cryogenic Etching of a Porous Organosilica Ultralow-k Film", ECS Solid State Lett. 2013 volume 2, issue 2, N5-N7) describes a technology in which the porous film is etched under an extremely low temperature to condense a reaction product in the porous film. In this technology, the reaction product condensed in the porous film restrains the radicals from entering the porous film. In order to condense such a reaction product, a temperature at the time of etching the porous film is set to be lower than or equal to −70° C.

In addition, Reference 2 (Markus H. Heyne et al., "Quantitative characterization of pore stuffing and unstuffing for postporosity plasma protection of low-k materials", Journal of Vacuum Science & Technology B32, 062202 (2014)) describes a technology in which the porous film is permeated with a polymethylmethacrylate resin (PMMA), and the PMMA restrains the radicals from entering the porous film. In this technology, after the etching of the porous film is finished, the PMMA is removed by a plasma process using a mixed gas of a hydrogen gas and a helium gas, or by a post-treatment such as laser annealing.

SUMMARY OF INVENTION

Technical Problem

In the etching at an extremely low temperature as in the technology described in Reference 1, it is impossible to use the plasma processing apparatus which includes a cooling mechanism using a usual cooling medium, and it is necessary to use a plasma processing apparatus which includes a cooling mechanism using, for example, liquid nitrogen or the like. Therefore, in this etching at an extremely low temperature, the running cost increases. In addition, in the technology described in Reference 2, a step of allowing the PMMA to permeate the porous film is necessary, and a dedicated processing apparatus is necessary. Further, in the technology described in Reference 2, the porous film may be damaged by the post-treatment for removing the PMMA.

Therefore, an improved method for etching a porous film which is capable of reducing damage of the porous film is necessary.

Solution to Problem

In one aspect, a method of etching a porous film is provided. The method includes (a) a step (hereinafter, referred to as a "pore sealing step") of supplying a first gas into a processing chamber of a plasma processing apparatus in which an object to be processed including a porous film is accommodated, and (b) a step (hereinafter, referred to as an "etching step") of generating a plasma of a second gas for etching the porous film in the processing chamber. The first gas is a processing gas having a saturated vapor pressure of less than or equal to 133.3 Pa at a temperature of a stage on which the object is mounted in the processing chamber, or includes the processing gas. In addition, in the pore sealing step, no plasma is generated, and a partial pressure of the processing gas supplied into the processing chamber is greater than or equal to 20% of the saturated vapor pressure. In one embodiment, a pressure of a space in the processing chamber in the pore sealing step is set to a pressure of less than or equal to 133.3 Pa (1 Torr). In addition, in one embodiment, a pressure of a space in the processing chamber in the etching step is set to a pressure less than or equal to 40 Pa (300 mTorr). Furthermore, the pressure of the space in the processing chamber in the etching step may be set to be less than or equal to 13.33 Pa (100 mTorr).

In the method according to the one aspect, in order to seal pores of the porous film, the processing gas having a saturated vapor pressure of less than or equal to 133.3 Pa at a stage temperature is used, and the processing gas is supplied into the processing chamber at the partial pressure which is less than or equal to 20% of the saturated vapor pressure. In the pore sealing step using the processing gas of such a partial pressure, the processing gas in the pores of the porous film is liquefied by capillary condensation, and the liquid in the pores restricts radicals generated in the etching step from entering the pores of the porous film. The liquefaction may be performed at a temperature which is available by a usual cooling mechanism of a plasma processing apparatus, for example, at a temperature of approximately −50° C., or at a temperature of higher than or equal to −50° C., instead of an extremely low temperature. In addition, the liquid generated by the liquefaction of the processing gas is vaporized, for example, by setting the temperature of the object to be processed to ordinary temperature, and thus can be easily removed. Therefore, it is possible to protect the porous film from the radicals for etching, without using the cooling mechanism for adjusting the temperature of the object to be processed to an extremely low temperature, and it is possible to reduce damage of the porous film.

In one embodiment, a sequence including the pore sealing step and the etching step may be repeatedly performed. The liquid introduced into the pores of the porous film by the pore sealing step may vaporize during the etching step. According to this embodiment, the etching step is performed for a period of time during which the protection of the porous film by the liquid is maintained, and the pore sealing step and the etching step are performed again. Accordingly, it is possible to ensure an etching amount while reducing damage of the porous film.

The method in one embodiment further includes a step (hereinafter, referred to as a "gas substituting step") of supplying the second gas into the processing chamber without generating a plasma between the pore sealing step and the etching step. According to this embodiment, after the first gas in the processing chamber is replaced with the second gas by the gas substituting step, the plasma is generated. Therefore, generation of unnecessary active species is suppressed.

In one embodiment, the processing gas used in the pore sealing step may be a fluorocarbon gas. In one embodiment, the processing gas includes at least one of $C_7F_8$ gas and $C_6F_6$ gas, and the partial pressure of the processing gas supplied into the processing chamber in the pore sealing step may be set to be less than or equal to 100% of the saturated vapor pressure.

In one embodiment, the processing gas used in the pore sealing step may be a hydrocarbon gas. In one embodiment, the processing gas may be an oxygen-containing hydrocarbon gas. The processing gases of these embodiments may be used in the pore sealing step. In one embodiment, the number of oxygen atoms in molecules included in the processing gas may be less than or equal to $\frac{1}{2}$ of the number of carbon atoms in the molecules. According to this processing gas, it is possible to liquefy the processing gas in the pores of the porous film while reducing damage of the porous film due to oxygen.

In one embodiment, the method may further include a step (hereinafter, referred to as a "removing step") of exhausting a gas generated by vaporizing the liquid which is generated from the processing gas and exists in the porous film. In the removing step, the temperature of the object to be processed including the porous film is set to be higher than or equal to ordinary temperature (for example, 20° C.) in the processing chamber of the plasma processing apparatus which is used in the pore sealing step and the etching step. Alternatively, in the removing step, the temperature of the object to be processed including the porous film in a dedicated apparatus is set to be higher than or equal to ordinary temperature (for example, 20° C.). The dedicated apparatus may by connected to the plasma processing apparatus used in the pore sealing step and the etching step, via a vacuum transfer system.

Advantageous Effects of Invention

As described above, the improved method for etching a porous film is provided, and it becomes possible to protect the porous film from the radicals for etching, without using the cooling mechanism for adjusting the temperature of the object to be processed to an extremely low temperature, and it becomes possible to reduce damage of the porous film.

DESCRIPTION OF EMBODIMENTS

Figure 1:
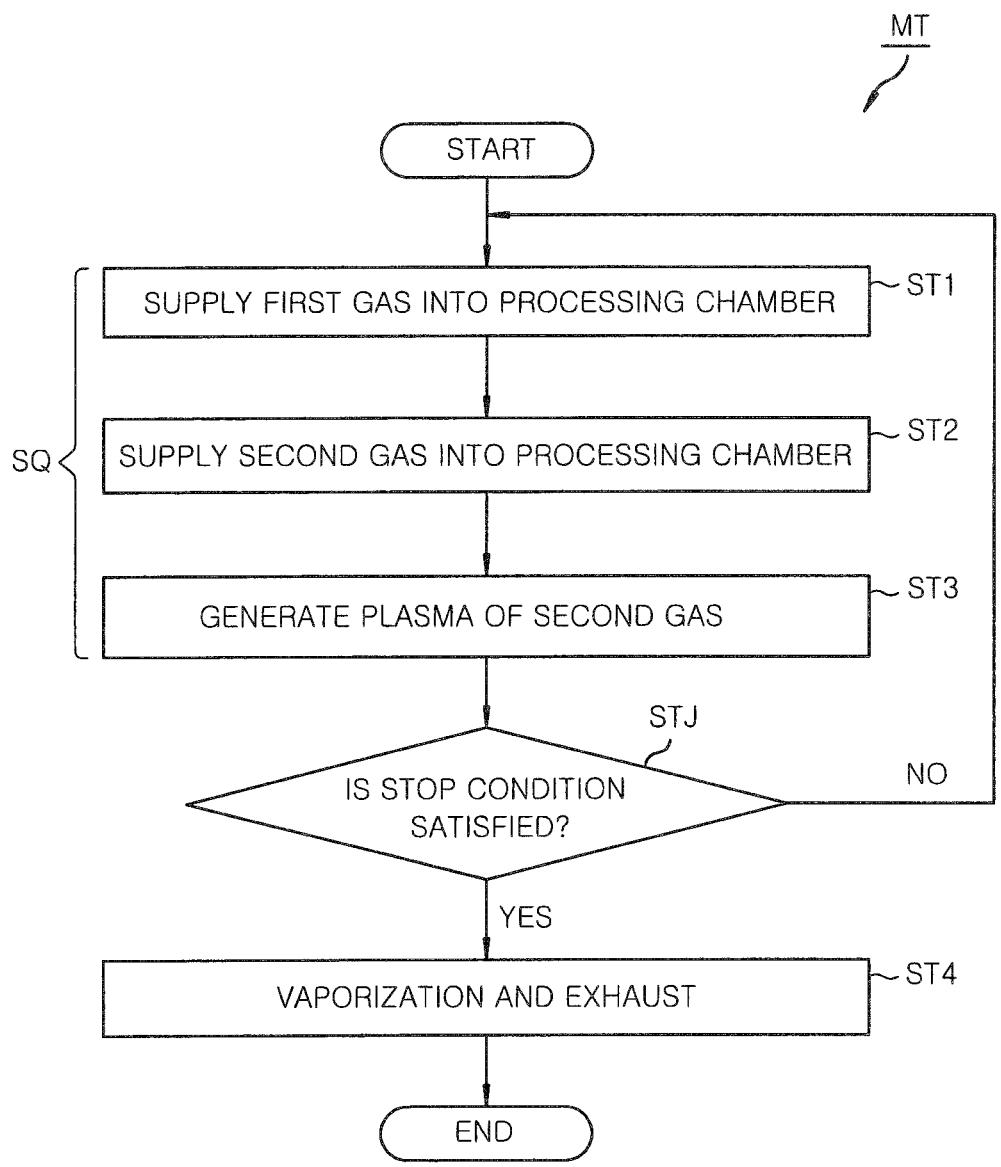
FIG. 1 is a flowchart illustrating a method of etching a porous film according to one embodiment.

Hereinafter, various embodiments will be described in detail with reference to the drawings. Furthermore, the same reference numerals are applied to the same or the corresponding parts in each of the drawings.

Figure 2:
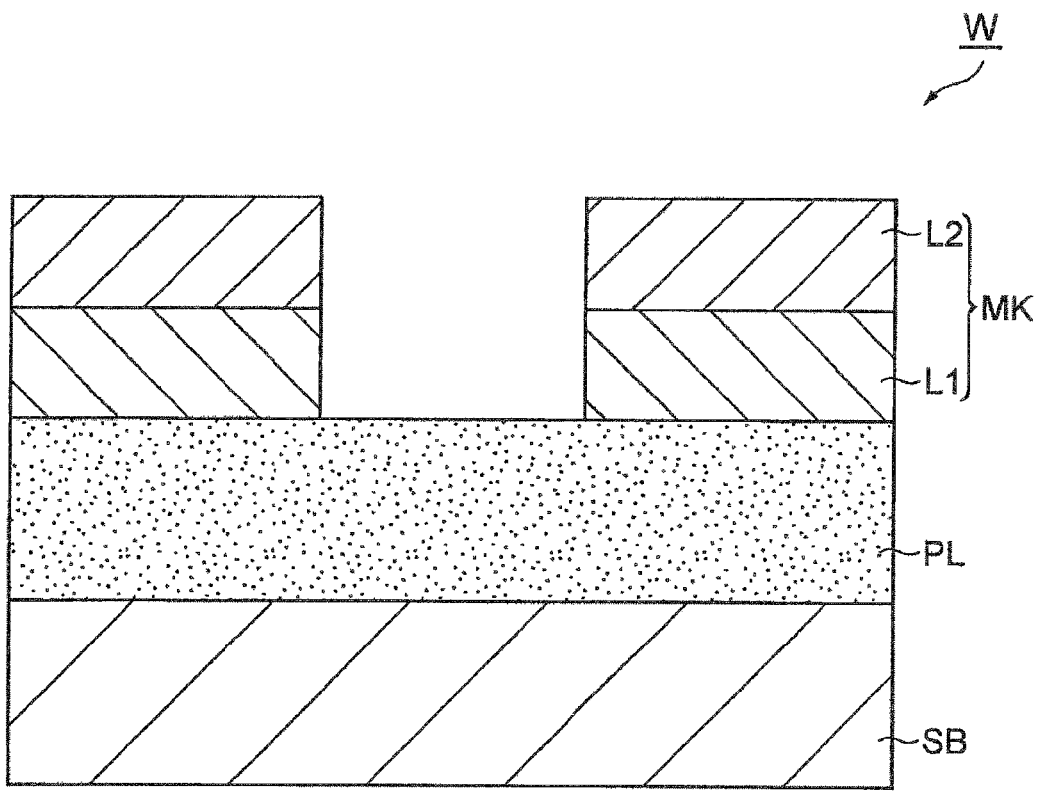
FIG. 2 is a cross-sectional view illustrating an example of an object to be processed.

FIG. 1 is a flowchart illustrating a method of etching a porous film according to one embodiment. A method MT illustrated in FIG. 1 is a method of etching a porous film of an object to be processed. FIG. 2 is a cross-sectional view illustrating an example of the object to be processed. The object to be processed (hereinafter, may also be referred to as a "wafer W") illustrated in FIG. 2 is provided with a substrate SB, a porous film PL, and a mask MK. The porous film PL is disposed on the substrate SB. In the porous film PL, a plurality of pores is formed. The pores may have an average width of a few nm, for example, 1 nm to 2 nm. It should be noted that the average width is an average value of maximum widths of the respective pores. In addition, the porous film is a film formed of a low dielectric constant material, such as a SiOC film. The porous film PL may be formed, for example, by a film forming method such as a CVD method or a spin film forming method.

The mask MK is disposed on the porous film PL. In one instance, the mask MK may include a first layer L1 and a second layer L2. For example, the first layer L1 may be a silicon oxide film, and the second layer L2 may be a TiN film. In the mask MK, a pattern which is supposed to be transferred to the porous film PL is formed. For example, in the mask MK, a pattern having an opening is formed. Such a mask MK may be formed by using a lithography technology and plasma etching. The plasma etching may be performed in a series of steps of the method MT by using a plasma processing apparatus 10.

Figure 3:
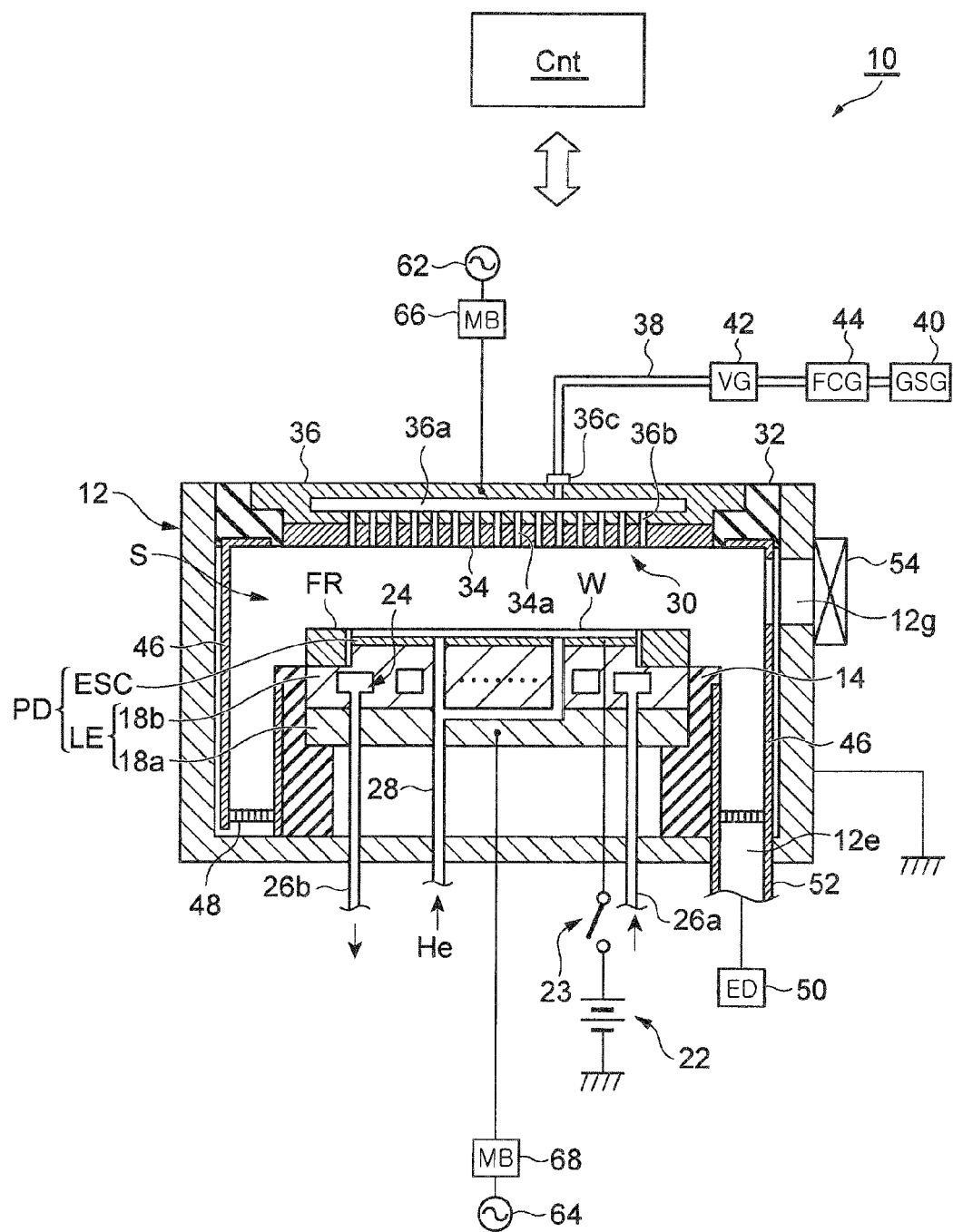
FIG. 3 is a diagram schematically illustrating a plasma processing apparatus according to one embodiment.

In the method MT, prior to Step ST1, the wafer W is accommodated in a processing chamber of a plasma processing apparatus. FIG. 3 is a diagram schematically illustrating a plasma processing apparatus according to one embodiment. In FIG. 3, the structure in a vertical section of the plasma processing apparatus of an example which may be used for performing the method MT is schematically illustrated. The plasma processing apparatus 10 illustrated in FIG. 3 is a capacitive coupling plasma etching apparatus, and is provided with a processing chamber 12 having an approximately cylindrical shape. An inner wall surface of the processing chamber 12, for example, is formed of aluminum to which an anodic oxidization treatment is applied. The processing chamber 12 is frame grounded.

On a bottom portion of the processing chamber 12, a support portion 14 having an approximately cylindrical shape is disposed. The support portion 14, for example, is formed of an insulating material. The support portion 14 vertically extends in the processing chamber 12 from the bottom portion of the processing chamber 12. In the processing chamber 12, a stage PD is disposed. The stage PD is supported by the support portion 14.

The wafer W accommodated in the processing chamber 12 of the plasma processing apparatus 10 is mounted on the stage PD, and the stage PD holds the wafer W. The stage PD includes a lower electrode LE and an electrostatic chuck ESC. The lower electrode LE includes a first plate 18a and a second plate 18b. The first plate 18a and the second plate 18b, for example, are formed of metal such as aluminum, and have an approximately disc shape. The second plate 18b is disposed on the first plate 18a, and is electrically connected to the first plate 18a.

On the second plate 18b, the electrostatic chuck ESC is disposed. The electrostatic chuck ESC has a structure in which an electrode which is a conductive film is arranged between a pair of insulating layers or insulating sheets. A direct current power source 22 is electrically connected to the electrode of the electrostatic chuck ESC via a switch 23. This electrostatic chuck ESC attracts the wafer W by an electrostatic force such as a Coulomb force which is generated by a direct current voltage from the direct current power source 22. Accordingly, the electrostatic chuck ESC is able to hold the wafer W. A heater may be embedded in the electrostatic chuck ESC, and a heater power source disposed outside the processing chamber 12 may be connected to the heater.

A focus ring FR is arranged on a peripheral portion of the second plate 18b to surround the edges of the wafer W and the electrostatic chuck ESC. The focus ring FR is provided to improve etching uniformity. The focus ring FR is formed of a material which is suitably selected depending on a material of an etching target film, and for example, may be formed of a material such as silicon and quartz.

A cooling medium flow path 24 is formed in the inside of the second plate 18b. The cooling medium flow path 24 constitutes a temperature adjustment mechanism. A cooling medium is supplied to the cooling medium flow path 24 from a chiller unit which is disposed outside the processing chamber 12 through a pipe 26a. The cooling medium supplied to the cooling medium flow path 24 returns to the chiller unit through a pipe 26b. Thus, the cooling medium is circulated between the cooling medium flow path 24 and the chiller unit. By controlling the temperature of the cooling medium, the temperature of the wafer W which is supported on the electrostatic chuck ESC is controlled. As for the cooling medium, a general cooling medium which is capable of cooling the wafer W at a temperature of higher than or equal to −50° C. is used, for example. As such a cooling medium, Galden (registered trademark) is exemplified.

In addition, in the plasma processing apparatus 10, a gas supply line 28 is provided. The gas supply line 28 supplies a heat transfer gas, for example, He gas, from a heat transfer gas supply mechanism, between an upper surface of the electrostatic chuck ESC and a back surface of the wafer W.

In addition, the plasma processing apparatus 10 is provided with an upper electrode 30. The upper electrode 30 is arranged above the stage PD to face the stage PD. The lower electrode LE and the upper electrode 30 are arranged to be approximately parallel with each other. A processing space S for performing a plasma processing with respect to the wafer W is provided between the upper electrode 30 and the lower electrode LE.

The upper electrode 30 is held at an upper portion of the processing chamber 12 through an insulating shielding member 32. The upper electrode 30 may include an electrode plate 34 and an electrode holding body 36. The electrode plate 34 faces the processing space S, and a plurality of gas injection holes 34a is formed in the electrode plate 34. The electrode plate 34 is formed of a material such as silicon or a silicon oxide.

The electrode holding body 36 detachably holds the electrode plate 34, and may be formed of, for example, a conductive material such as aluminum. The electrode holding body 36 may have a water cooling structure. In an inner portion of the electrode holding body 36, a gas diffusion space 36a is formed. From the gas diffusion space 36a, a plurality of gas circulation holes 36b extends downward to communicate with the gas injection holes 34a. In addition, a gas introduction port 36c for introducing a processing gas into the gas diffusion space 36a is formed in the electrode holding body 36, and a gas supply pipe 38 is connected to the gas introduction port 36c.

A gas source group 40 (GSG) is connected to the gas supply pipe 38 through a valve group (VG) 42 and a flow rate controller group (FCG) 44. The gas source group 40 includes a plurality of gas sources. The plurality of gas sources includes one or more gas sources for supplying a first gas and one or more gas sources for supplying a second gas. In addition, the plurality of gas sources of the gas source group 40 may include a gas source for a gas which is used in Step ST4 of the method MT to be described later, for example, argon or nitrogen gas.

The first gas includes a processing gas which is liquefied in the pores of the porous film PL. The first gas will be described later in detail in conjunction with the method MT. The second gas is a gas for etching the porous film PL. For example, the second gas may be a mixed gas including $SiF_4$ gas, $NF_3$ gas, and a rare gas such as Ar gas, or a mixed gas including $CF_4$ gas, $O_2$ gas, and a rare gas such as Ar gas.

The valve group 42 includes a plurality of valves, and the flow rate controller group 44 includes a plurality of flow rate controllers such as a mass flow controller. Each of the gas sources of the gas source group 40 is connected to the gas supply pipe 38 via a corresponding valve of the valve group 42 and a corresponding flow rate controller of the flow rate controller group 44.

In addition, a deposition shield 46 is detachably provided in the plasma processing apparatus 10 along an inner wall of the processing chamber 12. The deposition shield 46 is also disposed on the periphery of the support portion 14. The deposition shield 46 prevents an etching by-product (a deposition) from being attached to the processing chamber 12, and may be formed by coating an aluminum material with a ceramic such as $Y_2O_3$.

An exhaust plate 48 is disposed on a lower side of the processing chamber 12 and between the support portion 14 and a side wall of the processing chamber 12. The exhaust plate 48 may be formed, for example, by coating an aluminum material with a ceramic such as $Y_2O_3$. An exhaust port 12e is provided under the exhaust plate 48 and in the processing chamber 12. An exhaust device 50 is connected to the exhaust port 12e through an exhaust pipe 52. The exhaust device (ED) 50 includes a vacuum pump such as a turbo molecular pump, and is able to depressurize the space in the processing chamber 12 to a desired degree of vacuum. In addition, a loading/unloading port 12g of the wafer W is formed in the side wall of the processing chamber 12, and the loading/unloading port 12g can be opened and closed by a gate valve 54.

The plasma processing apparatus 10 further includes a first high frequency power source 62 and a second high frequency power source 64. The first high frequency power source 62 is an electric power source for generating a high frequency power for plasma generation, and generates a high frequency power having a frequency of, for example, 27 MHz to 100 MHz. The first high frequency power source 62 is connected to the upper electrode 30 via a matching box (MB) 66. The matching box 66 is a circuit for matching an output impedance of the first high frequency power source 62 with an input impedance of a load side (the upper electrode 30 side). It should be noted that the first high frequency power source 62 may be connected to the lower electrode LE via the matching box 66.

The second high frequency power source 64 is an electric power source for generating a high frequency bias power for attracting ions to the wafer W, and generates a high frequency bias power having a frequency within a range of, for example, 400 kHz to 13.56 MHz. The second high frequency power source 64 is connected to the lower electrode LE via the matching box (MB) 68. The matching box 68 is a circuit for matching an output impedance of the second high frequency power source 64 with an input impedance of the load side (the lower electrode LE side).

In one embodiment, the plasma processing apparatus 10 is further provided with a control unit Cnt. The control unit Cnt is a computer including a processor, a storage unit, an input device, a display device, and the like, and controls each unit of the plasma processing apparatus 10. With the control unit Cnt, it is possible for an operator to perform an input operation of a command or the like for managing the plasma processing apparatus 10 using the input device, and it is possible to visually display an operational status of the plasma processing apparatus 10 using the display device. Further, the storage unit of the control unit Cnt stores a control program for causing the processor to control various processes performed in the plasma processing apparatus 10, or a program for causing each unit of the plasma processing apparatus 10 to perform processes according to processing conditions, that is, a processing recipe.

Figure 4:
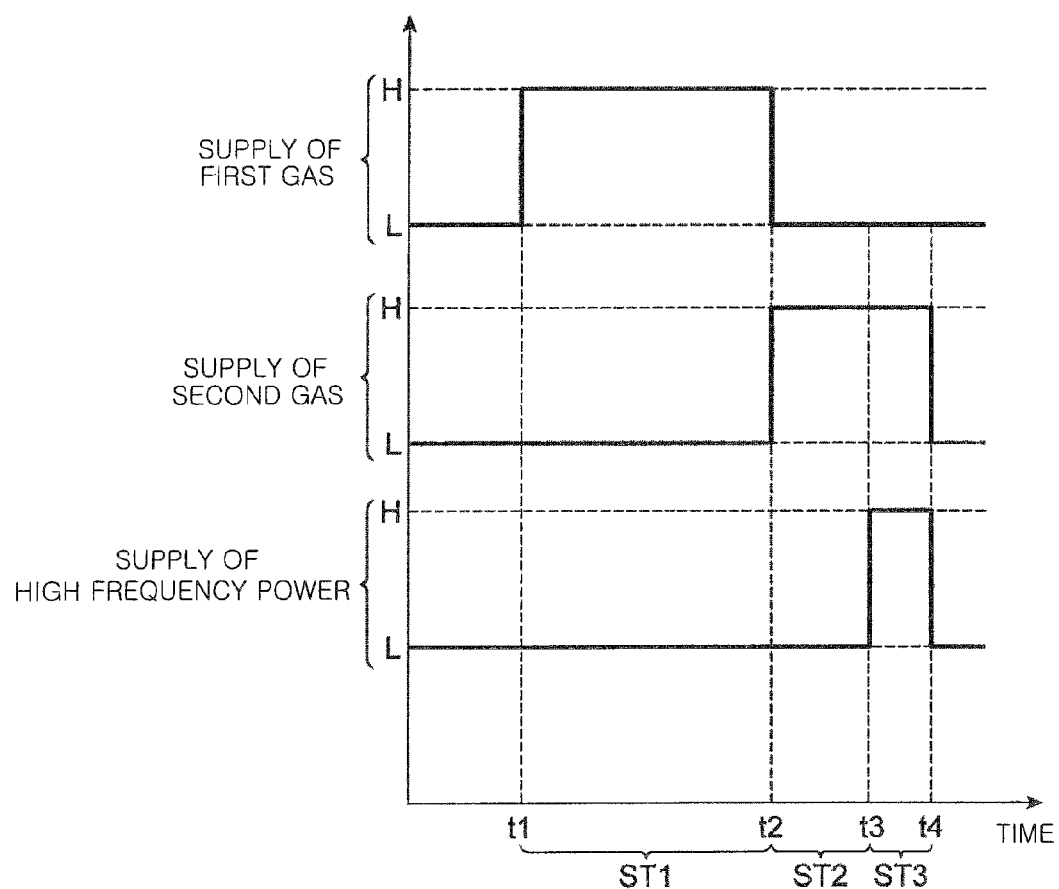
FIG. 4 is a timing chart of an example relevant to the method illustrated in FIG. 1.

Referring back to FIG. 1, the method MT will be described in detail. The following description refers to FIGS. 4 to 9 in addition to FIG. 1. FIG. 4 is a timing chart of an example relevant to the method MT. FIGS. 5 to 9 are cross-sectional views illustrating states of the object to be processed after performing respective steps of the method MT. In FIG. 4, a high level (indicated by "H" in FIG. 4) of supply of the first gas indicates that the first gas is supplied into the processing chamber of the plasma processing apparatus, and a low level (indicated by "L" in FIG. 4) of supply of the first gas indicates that the first gas is not supplied into the processing chamber of the plasma processing apparatus. In addition, a high level (indicated by "H" in FIG. 4) of supply of the second gas indicates that the second gas is supplied into the processing chamber of the plasma processing apparatus, and a low level (indicated by "L" in FIG. 4) of supply of the second gas indicates that the second gas is not supplied into the processing chamber of the plasma processing apparatus. In addition, a high level (indicated by "H" in FIG. 4) of supply of the high frequency power indicates that the high frequency power is supplied from the first high frequency power source 62, and thus the plasma is generated, and a low level (indicated by "L" in FIG. 4) of supply of the high frequency power indicates that the high frequency power is not supplied from the first high frequency power source 62, and thus the plasma is not generated.

In the method MT, first, Step ST1 is performed. In Step ST1, the first gas is supplied into the processing chamber 12, in a state where the wafer W is mounted on the stage PD. In FIG. 4, it is illustrated that the first gas is supplied into the processing chamber 12 between time t1 and time t2. In addition, in Step ST1, the pressure in the processing chamber 12 is set to a predetermined pressure by the exhaust device 50. Further, in Step ST1, the temperature of the stage PD is set to a temperature of higher than or equal to −50° C. In Step ST1, as illustrated in FIG. 4, the high frequency power is not supplied from the first high frequency power source 62. Therefore, in Step ST1, plasma is not generated.

The first gas is the processing gas which is liquefied in the pores of the porous film PL, or includes the processing gas. The processing gas is a gas having a saturated vapor pressure of less than or equal to 1 Torr (i.e. 133.3 Pa) at the temperature of the stage PD, for example, a temperature of higher than or equal to −50° C. The first gas is supplied into the processing chamber 12 such that the partial pressure of the processing gas is a partial pressure of greater than or equal to 20%.

Figure 5:
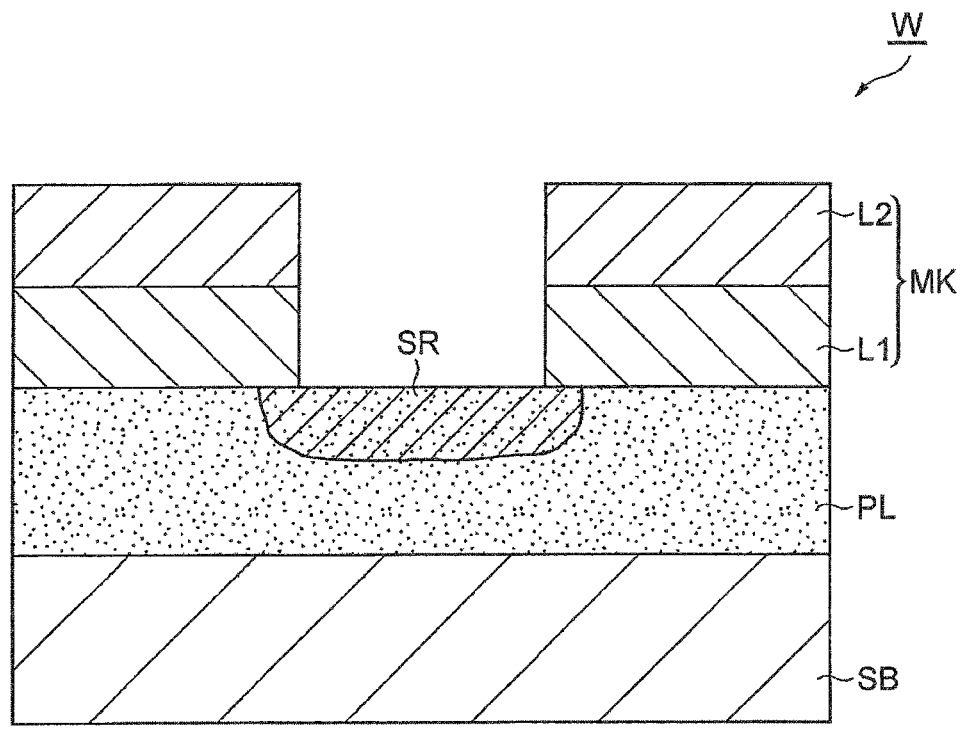
FIGS. 5 to 9 are cross-sectional views illustrating states of the object to be processed after performing respective steps of the method illustrated in FIG. 1.

In Step ST1, the processing gas of the first gas is liquefied in the pores of the porous film PL by capillary condensation. The capillary condensation is a phenomenon in which condensation or liquefaction of a gas occurs at a pressure lower than the saturated vapor pressure of the gas in a capillary. By the capillary condensation, even when the partial pressure of the processing gas is less than or equal to the saturated vapor pressure, the processing gas entering into the pores of the porous film PL is liquefied in the pores and becomes a liquid. When Step ST1 is performed, as illustrated in FIG. 5, a region SR is formed in the porous film PL, and in the region SR, the pores are filled with the liquid generated from the processing gas. The region SR extends over a range from a top surface of the porous film PL to a certain depth. Forming the region SR or filling the pores of the porous film PL by liquid enables that radicals generated by Step ST3 to be described later are restricted from entering the pores of the porous film PL. As a result thereof, damage of the porous film PL is reduced. The type of processing gas, and various conditions of Step ST1 will be described later in detail.

In the method MT, the supply of the first gas into the processing chamber 12 is stopped at the completion time of Step ST1, and subsequently, in one embodiment, Step ST2 is performed. In Step ST2, the second gas is supplied into the processing chamber 12. The second gas is formed of a mixed gas including $SiF_4$ gas, $NF_3$ gas, and a rare gas such as Ar gas, or a mixed gas including $CF_4$ gas, $O_2$ gas, and a rare gas such as Ar gas, and is also used in an etching process of Step ST3. In FIG. 4, it is illustrated that the supply of the first gas is stopped at the time t2 at which Step ST1 is terminated, the supply of the second gas into the processing chamber 12 is started from the time t2, and Step ST2 started at time t2 is continued until time t3. In addition, as illustrated in FIG. 4, the high frequency power is not supplied from the first high frequency power source 62 during a period of performing Step ST2. Therefore, in Step ST2, plasma is not generated.

In Step ST2, the pressure in the processing chamber 12 is set to a predetermined pressure by the exhaust device 50. The predetermined pressure is a pressure identical to the pressure in the processing chamber 12 at the time of performing Step ST3. In addition, in Step ST2, the temperature of the stage PD, that is, the temperature of the wafer W is set to a temperature identical to the temperature of the stage PD at the time of performing Step ST3, for example, a temperature of higher than or equal to −50° C.

In Step ST2, the first gas in the processing chamber 12 is replaced with the second gas without generating the plasma. Therefore, generation of unnecessary active species, that is, active species derived from the first gas is suppressed.

In subsequent Step ST3, the plasma of the second gas is generated. To this end, in Step ST3, a state is maintained in which the second gas is supplied into the processing chamber 12, and the high frequency power is supplied from the first high frequency power source 62. In FIG. 4, it is illustrated that the high frequency power is supplied from the first high frequency power source 62 during a period of performing Step ST3, that is, during a period from the time t3 to time t4. In addition, in Step ST3, the pressure in the processing chamber 12 is set to a predetermined pressure by the exhaust device 50. The predetermined pressure is a pressure of, for example, less than or equal to 300 mTorr (40 Pa). The predetermined pressure may be a pressure of less than or equal to 100 mTorr (13.33 Pa). In addition, in Step ST3, the temperature of the stage PD is set to a temperature of, for example, higher than or equal to −50° C. In Step ST3, the high frequency bias power may be supplied from the second high frequency power source 64 to the lower electrode LE.

Figure 6:
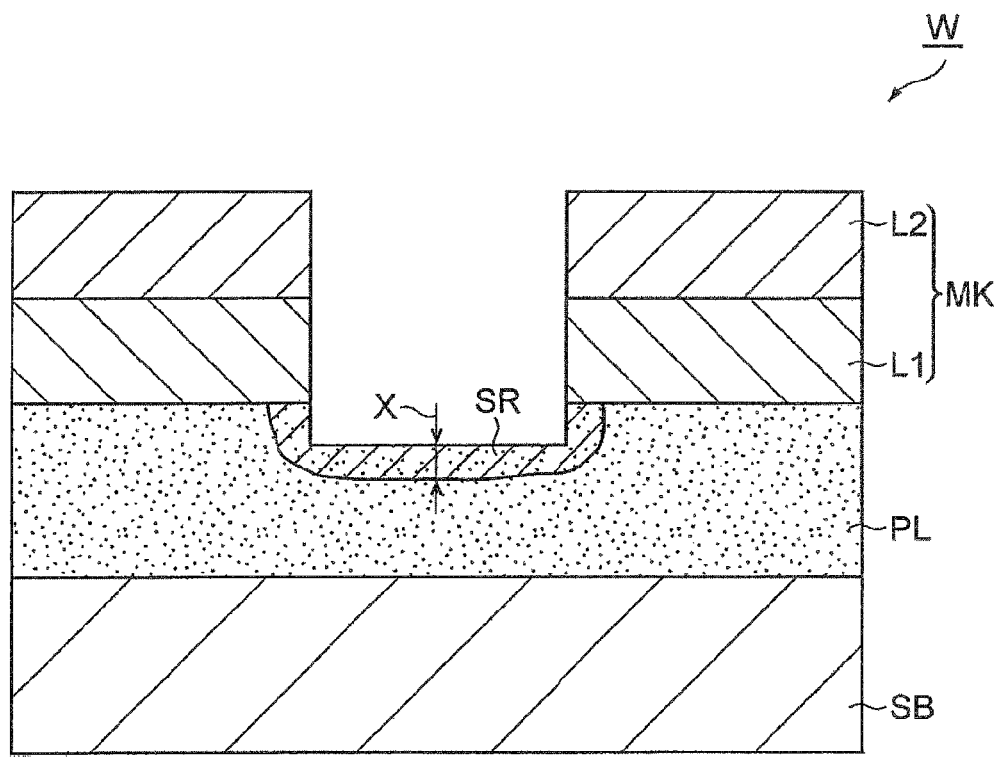

In Step ST3, the porous film PL is etched by the active species, for example, the radicals. Accordingly, as illustrated in FIG. 6, the porous film PL is etched in a portion exposed through the mask MK. As illustrated in FIG. 6, a region in which the porous film PL is etched in Step ST3 is a region shallower than the region SR with respect to the top surface of the porous film PL. That is, as illustrated in FIG. 6, the region SR remains by a certain depth (depth X) from a top surface of the porous film PL, after performing Step ST3.

Figure 7:
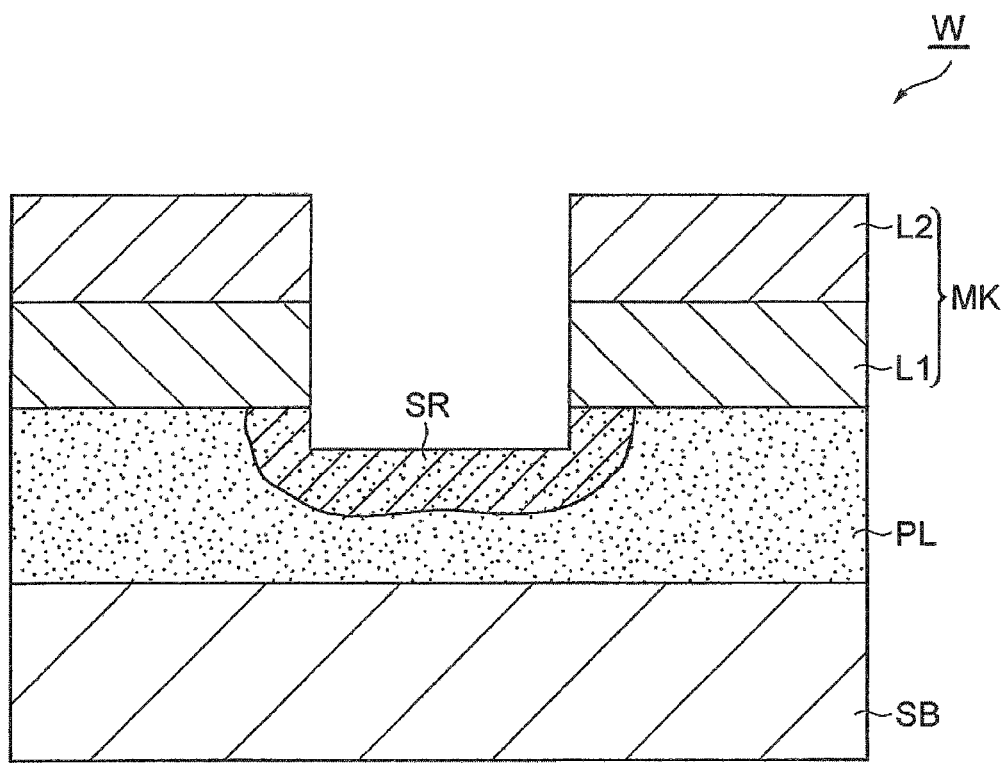
Figure 8:
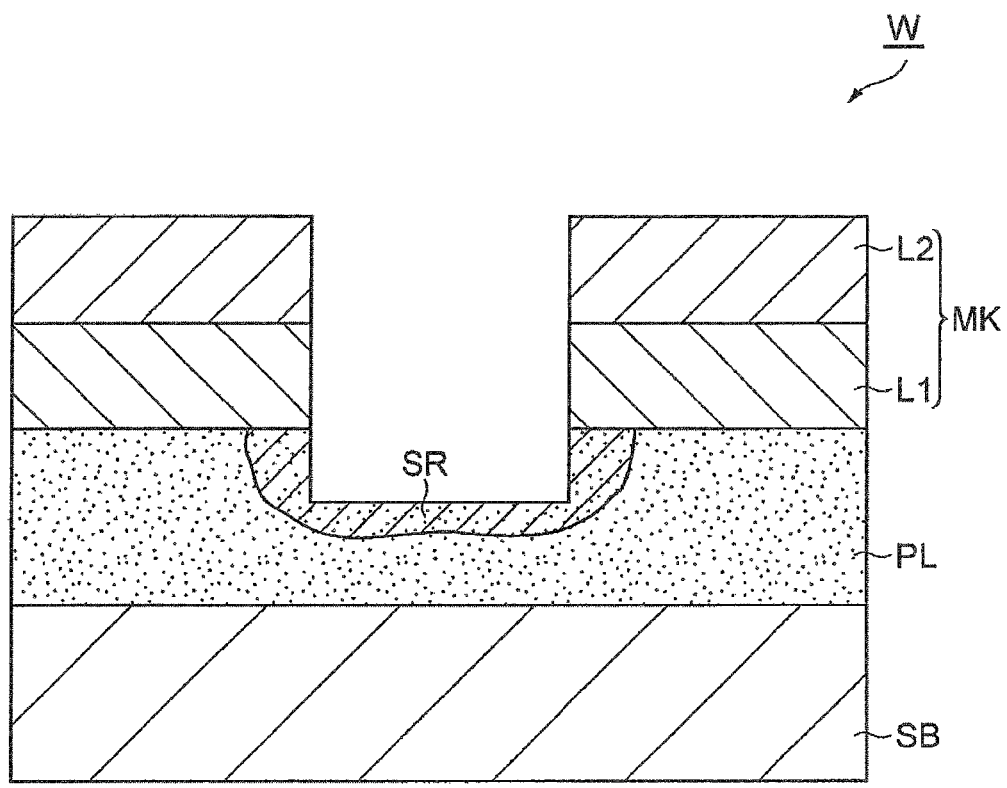

When Steps ST2 and ST3 described above are performed for a long period of time, supply of the second gas makes the partial pressure of the processing gas of the first gas existing in the processing chamber be lower than or equal to the saturated vapor pressure. Therefore, the processing gas entering in the pores of the porous film PL and then liquefied is vaporized again, and is discharged to the outside of the pores. That is, the liquid in the pores of the porous film PL is vaporized, and the porous film PL is in a state in which the radicals are able to enter the pores. For this reason, in one embodiment, a sequence SQ including Step ST1, Step ST2, and Step ST3 is repeatedly performed. That is, Step ST1 is performed, and thus, as illustrated in FIG. 7, the region SR is formed again in a range from the top surface of the porous film PL to a certain depth. Subsequently, Step ST2 is performed, and thus the first gas in the processing chamber 12 is replaced with the second gas. Subsequently, Step ST3 is performed, and the porous film PL is etched again, as illustrated in FIG. 8. Accordingly, the sequence SQ can be performed again until a protective effect by the liquid in the porous film PL is diminished, and thus it is possible to protect the porous film PL from the radicals, while ensuring the etching amount of the porous film PL.

In the method MT of one embodiment, in Step STJ, it is determined whether or not stop conditions are satisfied. When the number of times of performing the sequence SQ reaches a predetermined number of times, it is determined that the stop conditions are satisfied. In Step STJ, when it is determined that the stop conditions are not satisfied, the sequence SQ is performed again. In contrast, in Step STJ, when it is determined that the stop conditions are satisfied, the performing of the sequence SQ is terminated, and the process proceeds to Step ST4.

In Step ST4, a treatment is performed in which the liquid in the pores of the porous film PL is vaporized to generate the gas and exhaust the generated gas. Step ST4 of one embodiment may be performed in the plasma processing apparatus 10. In this embodiment, the temperature of the stage PD is set to a temperature at which the liquid in the pores is able to be vaporized. For example, the temperature of the stage PD is set to a temperature of higher than or equal to ordinary temperature (for example, 20° C.). In addition, in Step ST4, argon gas is supplied into the processing chamber 12, and the pressure in the processing chamber 12 is set to a predetermined pressure, for example, 0.1 Torr (13.33 Pa) by the exhaust device 50. In Step ST4, the liquid in the pores of the porous film PL is vaporized and becomes the gas, and the gas is exhausted from the space in the processing chamber 12 by the exhaust device 50. Accordingly, the liquid in the pores of the porous film PL is removed.

In Step ST4 of another embodiment, the wafer W may be placed under a temperature environment in which the liquid in the pores is able to be vaporized in another processing apparatus connected to the plasma processing apparatus 10 via a vacuum transfer system.

Figure 9:
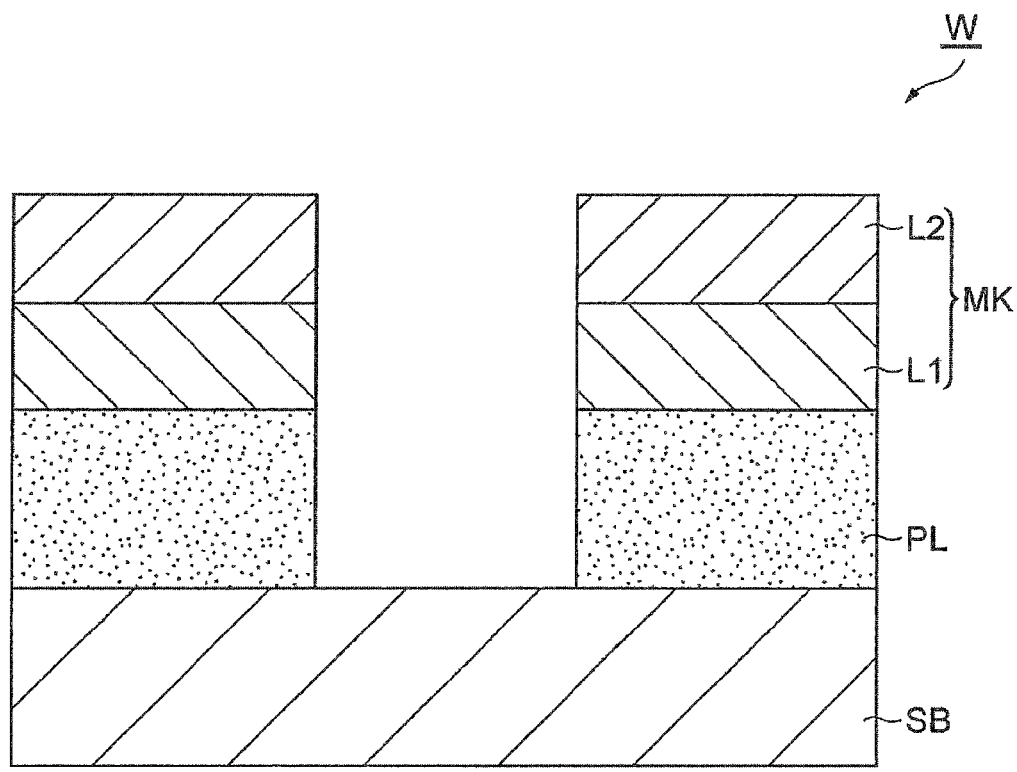

As illustrated in FIG. 9, performing such a method MT allows the pattern of the mask MK to be transferred to the porous film PL while damage of the porous film PL is reduced. In addition, according to the method MT, Step ST1, Step ST2, and Step ST3 can be performed by using a single plasma processing apparatus 10. Furthermore, in one embodiment, Step ST4 in addition to Step ST1, Step ST2, and Step ST3 can be performed by using the single plasma processing apparatus 10.

Hereinafter, the processing gas used in Step ST1, and the various conditions of Step ST1 will be described.

Figure 10:
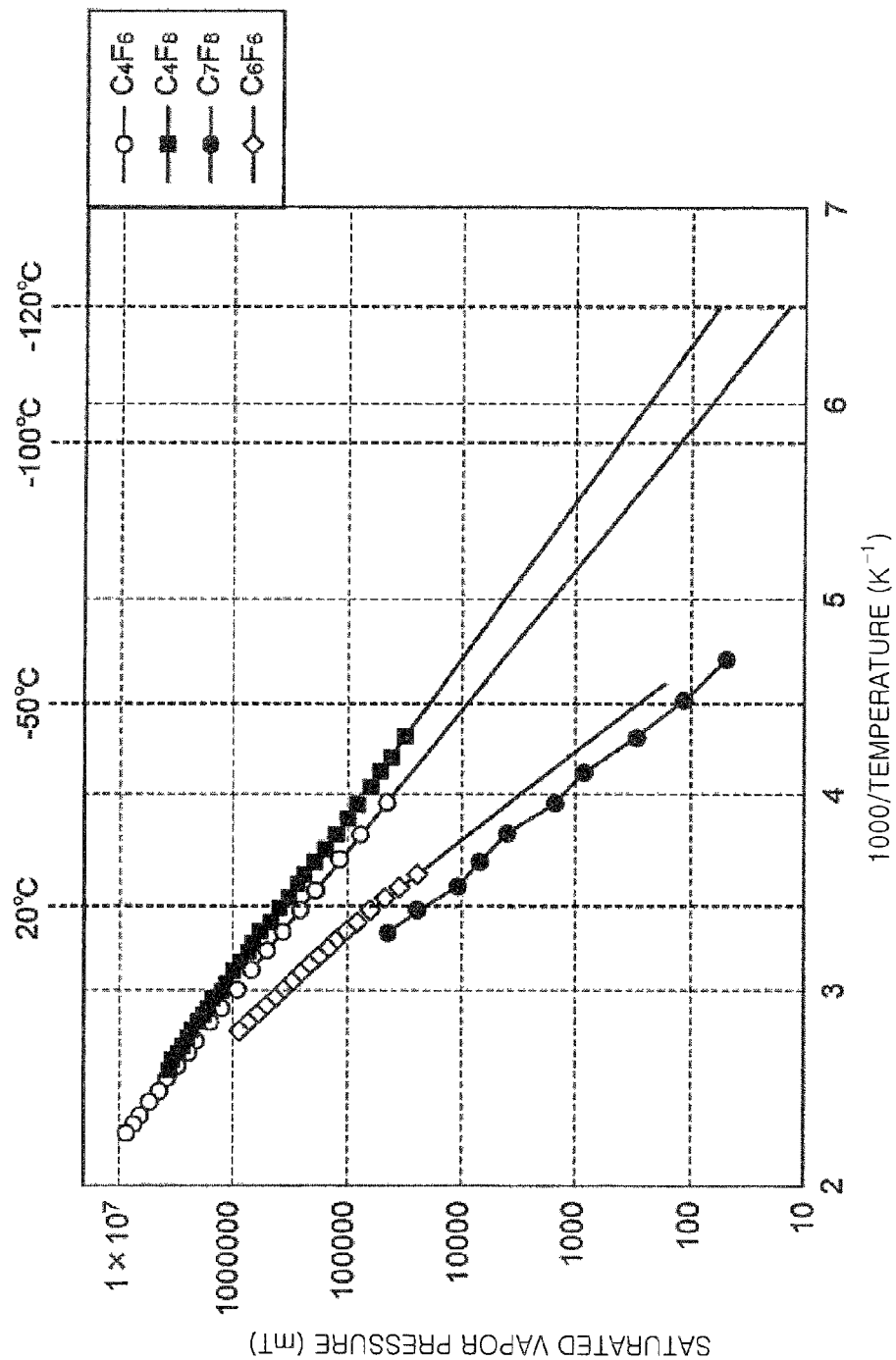
FIG. 10 is a graph illustrating a relationship between saturated vapor pressures of various fluorocarbon gases and the temperature of a stage PD.

A first example of the processing gas is a fluorocarbon gas. FIG. 10 is a graph illustrating a relationship between saturated vapor pressures of various fluorocarbon gases and the temperature of the stage PD. "1000/temperature" on a horizontal axis of the graph of FIG. 10 indicates a value which is obtained by dividing 1000 by the temperature of the stage PD, and a vertical axis indicates a $\log_{10}$ (saturated vapor pressure (mTorr)). Plots illustrated in FIG. 10 are actual measured values showing the relationship between the saturated vapor pressures of the various fluorocarbon gases and the temperature of the stage PD. As illustrated in FIG. 10, a plurality of actual measured values each showing the relationship between the saturated vapor pressure of each fluorocarbon gas and the temperature of the stage PD are positioned on an approximately straight line in the graph of FIG. 10.

It is known that the saturated vapor pressure is well-approximated by an experimental equation referred to as an Antoine Equation of the following Equation (1). In Equation (1), A, B, and C are constant values determined depending on a substance, T is an absolute temperature, and p is the saturated vapor pressure.

$$\log_{10} p = A - \frac{B}{T+C} \quad (1)$$

A relationship between the saturated vapor pressure p and the absolute temperature T which is defined by the Antoine Equation of Equation (1) is a linear relationship in the graph illustrated in FIG. 10. It should be noted that, when the constant value C is not zero, the straight line illustrated in FIG. 10 is just shifted to a horizontal direction, and thus the linear relationship still exists in the relationship between the saturated vapor pressure p and the absolute temperature T. Therefore, a relationship of a plurality of actual measured values relevant to each fluorocarbon gas illustrated in FIG. 10 is identical to the linear relationship defined by the Antoine Equation. Accordingly, it is possible to quantitatively predict a saturated vapor pressure in a temperature region having no actual measured value, by using the straight line extrapolated from the actual measured values.

As can be seen from the actual measured values shown in FIG. 10 or the straight line which is extrapolated on the basis of the actual measured values, the $C_7F_8$ gas and the $C_6F_6$ gas have a saturated vapor pressure of less than or equal to 1 Torr at a temperature higher than or equal to −50° C., which is available by the plasma processing apparatus 10. Therefore, as the first example of the processing gas, the $C_7F_8$ gas and the $C_6F_6$ gas can be used. However, the first example of the processing gas is not limited to the $C_7F_8$ gas and the $C_6F_6$ gas, and any fluorocarbon gas having a saturated vapor pressure of less than or equal to 1 Torr at a stage temperature may be used as the first example of the processing gas.

A second example of the processing gas is a hydrocarbon gas (i.e. $C_XH_Y$ gas), or an oxygen-containing hydrocarbon gas (i.e. $C_XH_YO_Z$ gas), where X, Y, Z are an integer larger than or equal to 1. As the second example of the processing gas, benzene ($C_6H_6$), n-butanol ($CH_3(CH_2)_2CH_2OH$), 2-butoxy ethanol ($CH_3(CH_2)_3OCH_2CH_2OH$), 2-ethoxy ethanol ($C_2H_5OCH_2CH_2OH$), cyclohexane ($C_6H_{12}$), dioxane ($OCH_2CH_2OCH_2CH_2$), ethanol ($C_2H_5OH$), ethyl acetate ($CH_3CO_2C_2H_5$), ethyl benzene ($C_2H_5C_6H_5$), ethyl cyclohexane ($C_6H_{11}C_2H_5$), methyl ethyl ketone ($C_2H_5COCH_3$), n-octane ($CH_3(CH2)_6CH_3$), 1-propanol ($CH_3CH_2CH_2OH$), 2-propanol (($CH_3$)$_2$CHOH), and toluene ($C_6H_5CH_3$) are exemplified.

Figure 11:
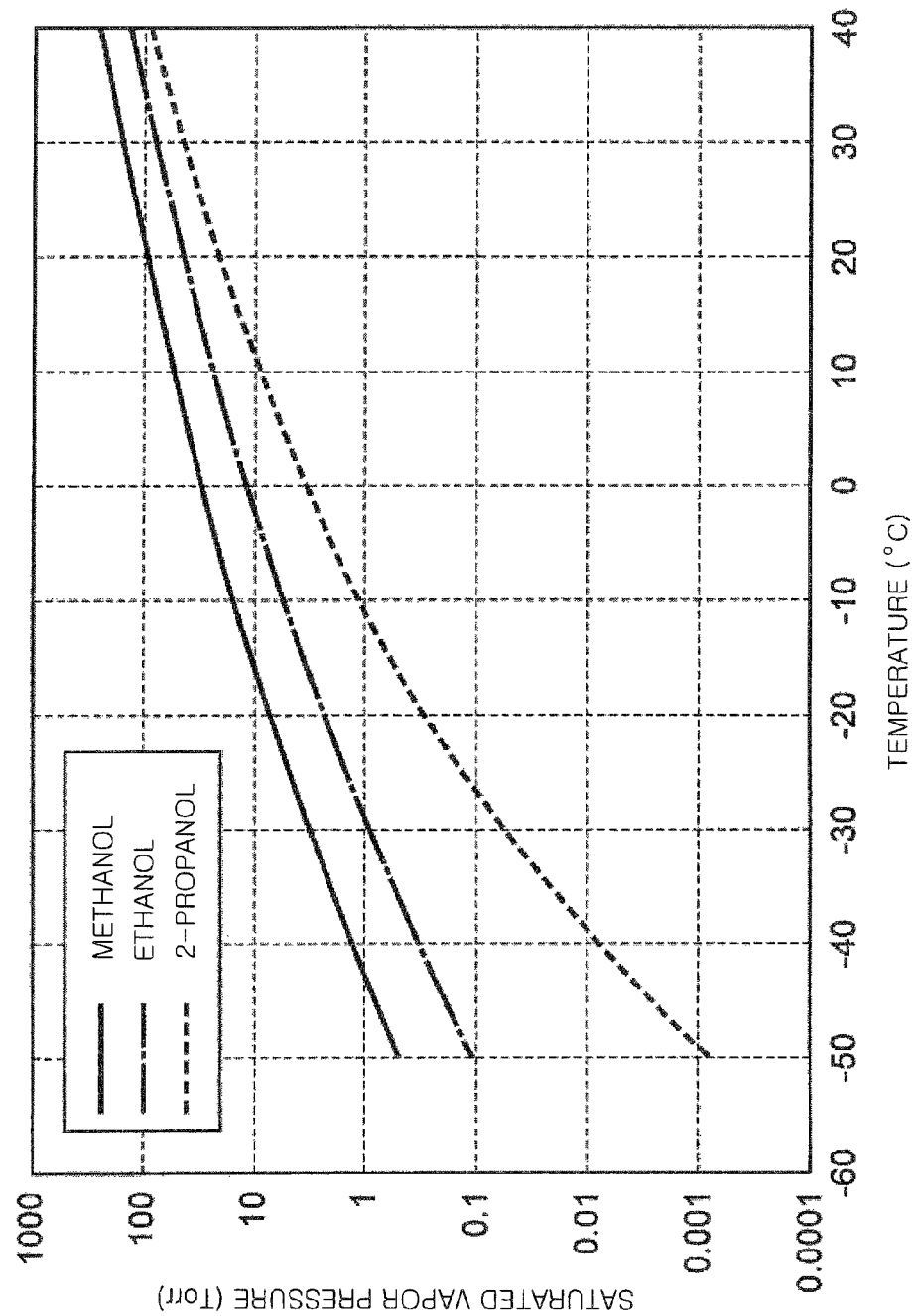
FIG. 11 is a graph illustrating a relationship between a saturated vapor pressure of another example of the processing gas and the temperature of the stage PD.

FIG. 11 is a graph illustrating a relationship between a saturated vapor pressure of the second example of the processing gas and the temperature of the stage PD. In FIG. 11, a relationship between saturated vapor pressures (a vertical axis; unit: Torr) of methanol, ethanol, and 2-propanol as the second example of the processing gas, and the temperature of the stage PD (a horizontal axis; unit: ° C.) is illustrated. As illustrated in FIG. 11, the processing gas of the second example also has a saturated vapor pressure of less than or equal to 1 Torr at a temperature higher than or equal to −50° C., which is available by the plasma processing apparatus 10.

The second example of the processing gas may be a processing gas in which the number of oxygen atoms in molecules included in the processing gas is less than or equal to ½ of the number of carbon atoms in the molecules. As such a second example of the processing gas, a gas other than methanol among the gases exemplified above may be used. According to the processing gas having such an atomic ratio, it is possible to reduce damage of the porous film PL caused by oxygen.

In Step ST1 of one embodiment, the first gas is supplied into the processing chamber 12 such that the partial pressure of the processing gas becomes greater than or equal to 20% and less than or equal to 100% of the saturated vapor pressure of the processing gas at the temperature of the stage PD. In addition, in Step ST1, the pressure of the space in the processing chamber 12 is set to a pressure of less than or equal to 1 Torr, that is, 133.3 Pa (Pa). Furthermore, the partial pressure of the processing gas in Step ST1, the temperature of the stage PD, and the pressure of the space in the processing chamber 12 are set to suitable values from the numerical value range described above depending on the type of the processing gas in order to fill the pores of the porous film PL with the liquid. According to Step ST1, the processing gas enters in the pores of the porous film PL from the top surface of the porous film PL, and the processing gas entering in the pores is liquefied in the pores by the capillary condensation and becomes the liquid.

In addition, the pressure of the space in the processing chamber 12 of Step ST1 is set to a pressure of less than or equal to 1 Torr, and thus a difference between the pressure of the space in the processing chamber 12 of Step ST3 and the pressure of the space in the processing chamber 12 of Step ST1 decreases. Therefore, it is possible to shorten the time required for changing the first gas to the second gas and for changing a pressure at the time of the transition from Step ST1 to Step ST3. That is, it is possible to shorten the time required for Step ST2. As a result thereof, it is possible to reduce the amount of the liquid in the porous film PL which is vaporized in Step ST2.

When combustible gas such as the second example of the processing gas is used as the processing gas in Step ST1, it is necessary to ensure safety by diluting the processing gas with a large amount of a dilute gas such as $N_2$ gas to set the concentration of the processing gas in the first gas to below an explosion limit concentration. In addition, when a high pressure condition is used in Step ST1, it is necessary to exhaust a large amount of the first gas at the time of performing Step ST2, and thus it is necessary to exhaust a large amount of the dilute gas. However, by setting the pressure of the space in the processing chamber 12 of Step ST1 to a pressure of less than or equal to 1 Torr, it is possible to reduce the amount of the dilute gas, and the total amount of the first gas.

In another embodiment, the second example of the processing gas is used in Step ST1, and the first gas is supplied into the processing chamber 12 such that the partial pressure of the processing gas becomes greater than 100% of the saturated vapor pressure of the processing gas at the temperature of the stage PD. In addition, in Step ST1 of this embodiment, the pressure of the space in the processing chamber 12 is set to a pressure of less than or equal to 50 mTorr (6.666 Pa). The processing gas supplied at such a partial pressure can be liquefied not only in the pores of the porous film PL but also in the processing chamber 12. However, since the pressure in the processing chamber 12 is set to a low pressure of less than or equal to 50 mTorr, the number of molecules of the processing gas existing in the processing chamber 12 in Step ST1 is small. Therefore, it is possible to fill the pores of the porous film PL with the liquid generated by liquefaction of the processing gas while restricting the liquid from non-uniformly adhering to the surface of the porous film PL to form a micromask.

Hereinafter, experimental examples for evaluating the method MT will be described. It should be noted that the disclosure is not limited to these examples.

Experimental Example 1

In Experimental Example 1, a SiOC film (hereinafter, referred to as a "porous film 1") which was formed by a spin film forming method, and a SiOC film (hereinafter, referred to as a "porous film 2") which was formed by a CVD method were prepared. Then, the pressure of the space in the processing chamber 12 was set to a variable parameter, and Step ST1 was performed. In Step ST1, a gas comprised of $C_6F_6$ gas was used as the first gas. In addition, a flow rate of the first gas in Step ST1 was set to 30 sccm, and the temperature of the stage PD was set to −50° C.

Figure 12:
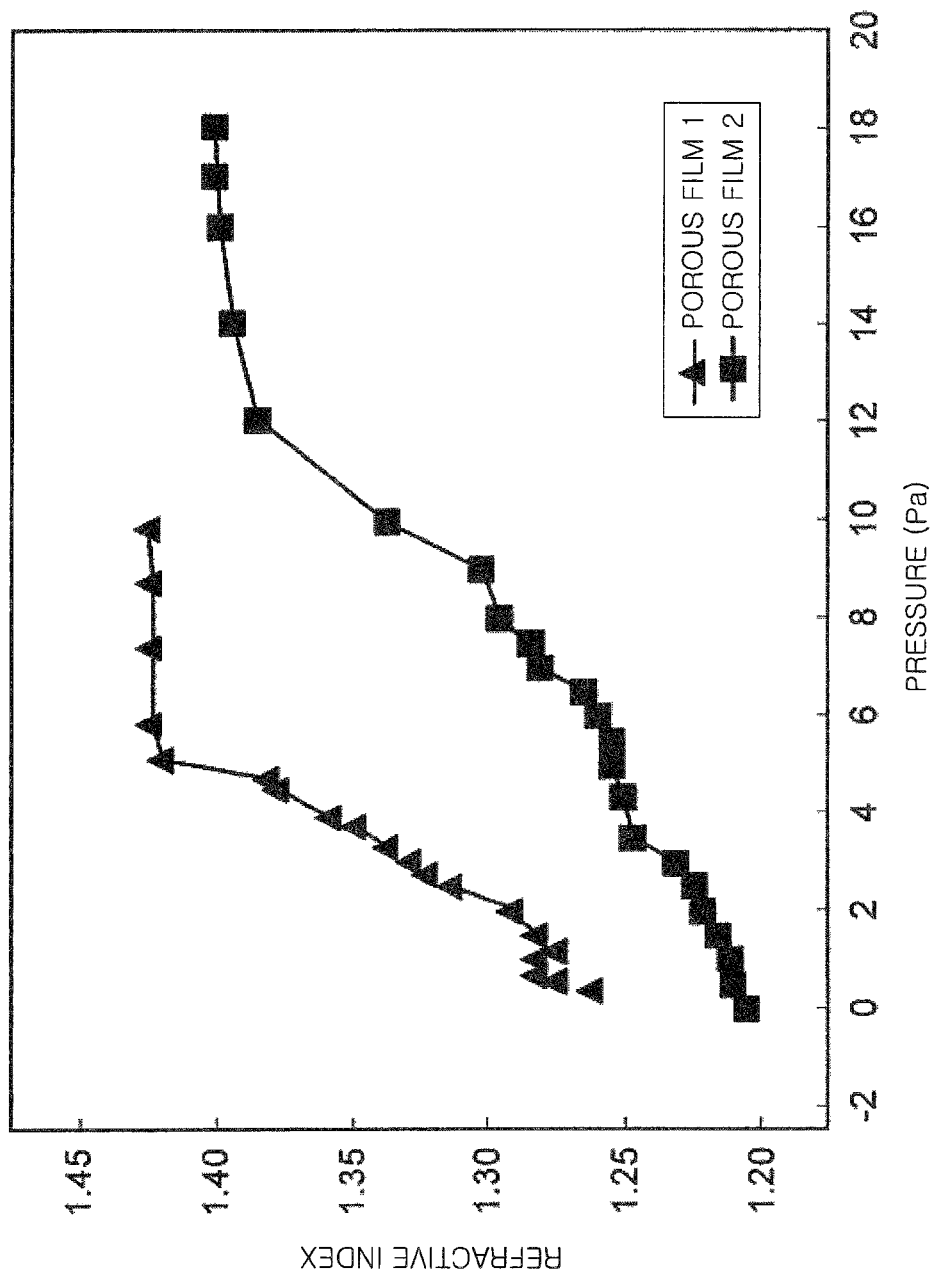
FIG. 12 is a graph illustrating a refractive index obtained by Experimental Example 1.

In Experimental Example 1, a refractive index of each of the porous film 1 and the porous film 2 after performing Step ST1 was obtained. In FIG. 12, the refractive indices obtained in Experimental Example 1 are illustrated. In FIG. 12, a horizontal axis indicates the pressure of the space in the processing chamber 12 at the time of performing Step ST1, and a vertical axis indicates the refractive index. The refractive index of the porous film in a state where the pores of the porous film are filled with the liquid is increased further than the refractive index of the porous film in a state where the pores are not filled with the liquid. Referring to the graph illustrated in FIG. 12, particularly in the porous film 1, when the pressure is greater than or equal to approximately 6 Pa, it is found that the refractive index is saturated at a high level. The pressure of 6 Pa is approximately 20% of the saturated vapor pressure of the $C_6F_6$ gas at −50° C., which is 27 Pa. Therefore, as the result of Experimental Example 1, it has been confirmed that when the processing gas is supplied into the processing chamber at the partial pressure greater than or equal to 20%, the processing gas in the pores of the porous film can be liquefied.

Experimental Example 2 and Experimental Example 3

In Experimental Example 2 and Experimental Example 3, a SiOC film (i.e. porous film) formed by a spin film forming method was prepared. Then, the method MT was performed under the following conditions. In addition, in Comparative Experimental Example 1, only the same step as Step ST3 of Experimental Example 2 was applied to the same porous film as that in Experimental Example 2 and Experimental Example 3. Furthermore, the object to be processed including the porous film after performing Step ST3 was transferred to another processing chamber connected to the plasma processing apparatus used for performing Step ST1 to Step ST3 through the vacuum transfer system, and the treatment of Step ST4 was performed in the process chamber.

Conditions of Experimental Example 2

First Gas in Step ST1: $C_6F_6$ gas (50 sccm)
Pressure in Processing chamber 12 in Step ST1: 0.1 Torr (13.33 Pa)
Temperature of Stage PD in Step ST1: −50° C.
Processing Time in Step ST1: 30 seconds
Second Gas in Step ST2: $NF_3/SiF_4/Ar$ gas (100/120/30 sccm)
Pressure in Processing chamber 12 in Step ST2: 0.1 Torr (13.33 Pa)
Temperature of stage PD in Step ST2: −50° C.
Processing Time in Step ST2: 10 seconds
Second Gas in Step ST3: $NF_3/SiF_4/Ar$ gas (120/100/30 sccm)
Pressure in Processing chamber 12 in Step ST3: 0.1 Torr (13.33 Pa)
Temperature of Stage PD in Step ST3: −50° C.
High Frequency Power in Step ST3: 60 MHz, 100 W
High Frequency Bias Power in Step ST3: 0.4 MHz, 50 W
Processing Time in Step ST3: 3 seconds
Number of Times of Performing Sequence SQ: 15 times
Temperature of Stage in Step ST4: 200° C.
Processing Time in Step ST4: 60 seconds Conditions of Experimental Example 3

Figure 13A:
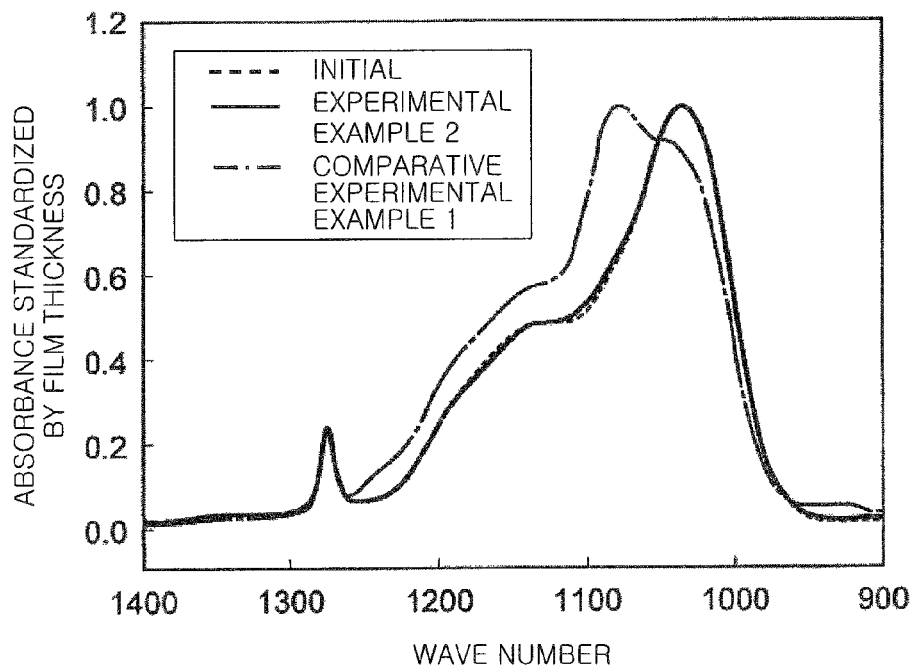
FIGS. 13A and 13B are graphs each illustrating a result of an FTIR analysis of a porous film after processing of Experimental Example 2, a porous film after processing of Experimental Example 3, and a porous film after processing of Comparative Experimental Example 1.
Figure 13B:
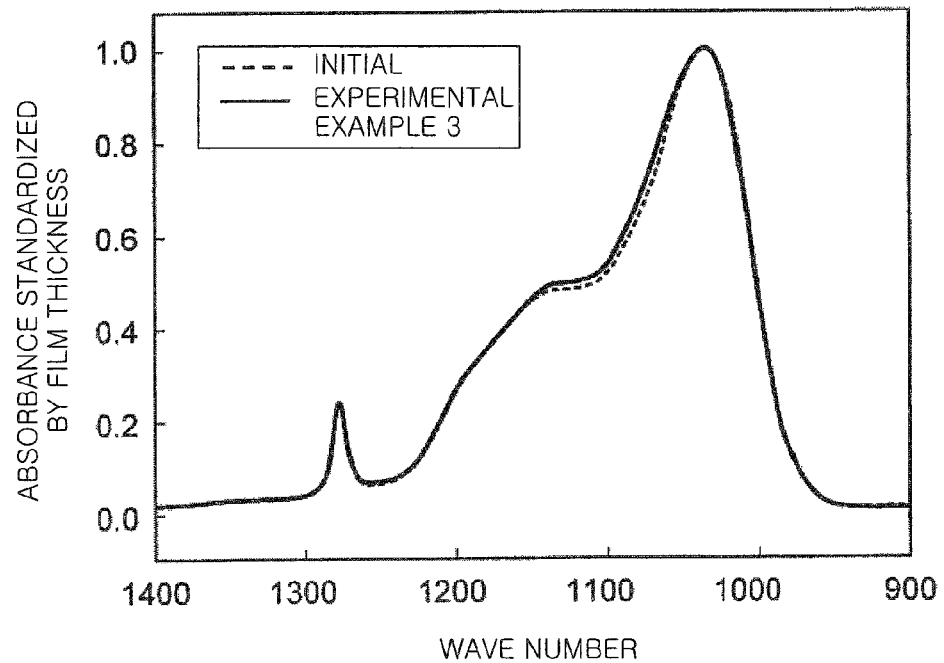

First Gas in Step ST1: 2-propanol (50 sccm)
Pressure in Processing chamber 12 in Step ST1: 0.14 Torr (18.67 Pa)
Temperature of Stage PD in Step ST1: −20° C.
Processing Time in Step ST1: 30 seconds
Second Gas in Step ST2: $NF_3/SiF_4/Ar$ gas (120/100/30 sccm)
Pressure in Processing chamber 12 in Step ST2: 0.1 Torr (13.33 Pa)
Temperature of Stage PD in Step ST2: −20° C.
Processing Time in Step ST2: 5 seconds
Second Gas in Step ST3: $NF_3/SiF_4/Ar$ gas (120/100/30 sccm)
Pressure in Processing chamber 12 in Step ST3: 0.1 Torr (13.33 Pa)
Temperature of Stage PD in Step ST3: −20° C.
High Frequency Power in Step ST3: 60 MHz, 100 W
High Frequency Bias Power in Step ST3: 0.4 MHz, 50 W
Processing Time in Step ST3: 3 seconds
Number of Times of Performing Sequence SQ: 15 times
Temperature of Stage in Step ST4: 200° C.
Processing Time in Step ST4: 60 seconds In Experimental Examples 2 and 3, the porous film after performing the method MT was analyzed by using a Fourier transform infrared spectrophotometer (FTIR). In FIG. 13A, spectra which are respective results of the FTIR analysis of the initial porous films (i.e. the porous film in a state prior to the processing of Experimental Example 2), the porous film in a state after the processing of Experimental Example 2, and the porous film in a state after the processing of Comparative Experimental Example 1 are illustrated. In addition, in FIG. 13B, spectra which are respective results of the FTIR analysis of the initial porous films (i.e. the porous film in a state prior to the processing of Experimental Example 3) and the porous film in a state after the processing of Experimental Example 3 are illustrated. As illustrated in FIG. 13A, the spectrum of the porous film in a state after the processing of Comparative Experimental Example 1 was considerably different from the spectrum of the initial porous film. That is, it was confirmed that when the etching of Step ST3 was performed without performing Step ST1, the porous film was damaged. On the other hand, as illustrated in FIG. 13A, the spectrum of the porous film in a state after the processing of Experimental Example 2 was approximately identical to the spectrum of the initial porous film. In addition, as illustrated in FIG. 13B, the spectrum of the porous film in a state after the processing of Experimental Example 3 was approximately identical to the spectrum of the initial porous film. Therefore, it has been confirmed that filling the pores of the porous film with the liquid by using the capillary condensation in Step ST1 as in Experimental Example 2 and Experimental Example 3 reduces damage of the porous film due to the etching of Step ST3.

Various embodiments have been described, but the aforementioned embodiments are not limiting, and various modifications are conceivable. For example, in the embodiments described above, the plasma processing apparatus 10 is used for performing the method MT, but the method MT may be performed by using any plasma processing apparatus such as an inductive coupling plasma processing apparatus, or a plasma processing apparatus for generating a plasma by a surface wave such as a microwave.

The invention claimed is:
1. A method of etching a porous film having pores, comprising:
supplying a first gas into a processing chamber of a plasma processing apparatus in which an object to be processed including the porous film is accommodated; and
generating a plasma of a second gas for etching the porous film in the processing chamber, wherein the first gas includes a processing gas having a saturated vapor pressure of less than or equal to 133.3 Pa at a temperature of a stage on which the object is mounted in the processing chamber, and wherein in said supplying the first gas, no plasma is generated, and a partial pressure of the processing gas supplied into the processing chamber is greater than or equal to 20% of the saturated vapor pressure such that the processing gas enters into the pores and is liquefied in the pores by capillary condensation, and wherein in said generating the plasma of the second gas, the porous film is etched while the pores are filled with the liquefied processing gas.

2. The method according to claim 1, wherein a sequence including said supplying the first gas and said generating the plasma of the second gas is repeatedly performed.

3. The method according to claim 1, further comprising: supplying the second gas into the processing chamber without generating the plasma between said supplying the first gas and said generating the plasma of the second gas.

4. The method according to claim 1, wherein a pressure of a space within the processing chamber in said supplying the first gas is less than or equal to 133.3 Pa.

5. The method according to claim 1, wherein a pressure of a space within the processing chamber in said generating the plasma of the second gas is less than or equal to 40 Pa.

6. The method according to claim 1, wherein the processing gas includes a fluorocarbon gas.

7. The method according to claim 1, wherein the processing gas includes at least one of $C_7F_8$ gas and $C_6F_6$ gas, and wherein in said supplying the first gas, the partial pressure of the processing gas which is supplied into the processing chamber is less than or equal to 100% of the saturated vapor pressure.

8. The method according to claim 1, wherein the processing gas is a hydrocarbon gas or an oxygen-containing hydrocarbon gas.

9. The method according to claim 8, wherein the number of oxygen atoms in molecules included in the processing gas is less than or equal to ½ of the number of carbon atoms in the molecules.

10. The method according to claim 1, further comprising:
exhausting a gas generated by vaporizing a liquid which is generated from the processing gas and exists in the porous film.

11. The method according to claim 1, wherein in said supplying the first gas, the partial pressure of the processing gas which is supplied into the processing chamber is less than or equal to 100% of the saturated vapor pressure and the temperature of the stage on which the object is mounted in the processing chamber is set to be higher than or equal to −50° C., and in said generating the plasma of the second gas, an average value of maximum widths of the respective pores is range from 1 nm to 2 nm.

* * * * *